(12) United States Patent (10) Patent No.: US 8,319,526 B2
Jansson (45) Date of Patent: Nov. 27, 2012

(54) LATCHED COMPARATOR CIRCUIT

(75) Inventor: Christer Jansson, Linköping (SE)

(73) Assignee: CSR Technology Inc., Sunnyvale, CA (US)

( * ) Notice: Subject to any disclaimer, the term of this patent is extended or adjusted under 35 U.S.C. 154(b) by 494 days.

(21) Appl. No.: 12/620,156

(22) Filed: Nov. 17, 2009

(65) Prior Publication Data

US 2011/0115529 A1 May 19, 2011

(51) Int. Cl.
*H03K 5/22* (2006.01)
(52) U.S. Cl. .................................. 327/65; 327/89
(58) Field of Classification Search .............. 327/63–65, 327/89
See application file for complete search history.

(56) References Cited

U.S. PATENT DOCUMENTS

| | | | |
|---|---|---|---|
| 5,920,208 A | 7/1999 | Park | |
| 6,046,612 A | 4/2000 | Taft | |
| 6,762,628 B2 * | 7/2004 | Ebner | 327/63 |
| 7,382,197 B2 * | 6/2008 | Iyer | 330/305 |
| 2002/0125917 A1 | 9/2002 | Barnes | |

FOREIGN PATENT DOCUMENTS

EP 0 827 151 A 3/1998

OTHER PUBLICATIONS

European Search Report, corresponding to EP 08 15 6867, date of completion of the search Nov. 26, 2008.

* cited by examiner

*Primary Examiner* — Quan Tra
(74) *Attorney, Agent, or Firm* — Lando & Anastasi, LLP

(57) ABSTRACT

A latched comparator circuit comprises an input amplification unit, a buffer unit, and a control unit. The input amplification unit comprises a first and a second input terminal for receiving a first and a second input voltage, respectively, of the latched comparator circuit. The input amplification unit further comprises a first and a second output terminal for outputting a first and a second output voltage, respectively, of the input amplification unit. In addition, the input amplification unit comprises a reset terminal arranged to receive a reset signal for resetting the input amplification unit. The buffer unit is operatively connected to the first and the second output terminal of the input amplification unit. Furthermore, the buffer unit comprises a first and a second output terminal for outputting a first and a second output voltage, respectively, of the buffer unit. The control unit is operatively connected to the input amplification unit and the buffer unit. The control unit is adapted to generate the reset signal based on the first and the second output voltage of the buffer unit and a clock signal and to generate an output signal of the latched comparator circuit based on the first and the second output voltage of the buffer unit. A method of operating the latched comparator circuit is also disclosed.

18 Claims, 7 Drawing Sheets

1

LATCHED COMPARATOR CIRCUIT

TECHNICAL FIELD

The present invention relates to a latched comparator circuit.

BACKGROUND

Latched comparators are used in various types of electronic circuitry for comparing e.g. two input voltages. For example, in an analog-to-digital converter (ADC), one or more latched comparators may be utilized for comparing an input voltage with one or more reference voltages for generating a digital value based on the input voltage. Furthermore, in memory circuits, such as a random-access memory (RAM), e.g. a static RAM (SRAM) or a dynamic RAM (DRAM), or a read-only memory (ROM), a latched comparator may be utilized as or in a sense amplifier of a read-out circuitry of the memory circuit for determining whether a logic '0' or '1' is stored in a memory cell of the memory circuit.

A latched comparator may have a differential output port comprising two output terminals. A latched comparator typically operates in two clock phases; a reset phase and a compare-and-latch phase. During the reset phase, the latched comparator is reset, e.g. by balancing the two output terminals of the latched comparators. During the compare-and-latch phase, the latched comparator is operative to compare the two input voltages and generate a differential output voltage corresponding to a logic '0' or '1' based on the two input voltages.

A latched comparator typically includes one or more cross-coupled transistor pairs, such as a cross-coupled NMOS pair and/or a cross-coupled PMOS pair, operatively connected between two output terminals. The one or more cross-coupled transistor pairs provide a positive feedback loop. The positive feedback loop forces one of the output terminals to a first voltage level, such as the supply voltage, and the other output terminal to another voltage level, such as ground, during the compare phase based on the two input voltages.

A latched comparator may comprise a switch connected between the two output terminals. During the reset phase, the switch is closed for balancing the voltages at the two output terminals, i.e. forcing the voltages to a common level. Alternatively or additionally, the latched comparator may comprise switches connected between each of the output terminals of the latched comparator and a common reference voltage level, such as the supply voltage or ground. Said switches are closed during the reset phase and open during the compare-and-latch phase.

The operational speed of a latched comparator may be a limiting factor for the operational speed of electronic circuits comprising the latched comparator. For example, the operational speed of a latched comparator may be a limiting factor for the maximum sampling frequency of an ADC comprising the latched comparator. As another example, the operational speed of a latched comparator utilized for sense amplification in a memory circuit may be a limiting factor for the maximum read-out rate of the memory circuit. Hence, there is a need for a latched comparator circuit having an improved operational speed.

SUMMARY

Accordingly, an object of the present invention is to provide a latched comparator circuit with improved operational speed.

According to a first aspect, a latched comparator circuit comprising an input amplification unit is provided. The input amplification unit comprises a first and a second input terminal for receiving a first and a second input voltage, respectively, of the latched comparator circuit. Furthermore, the input amplification unit comprises a first and a second output terminal for outputting a first and a second output voltage, respectively, of the input amplification unit. Moreover, the input amplification unit comprises a reset terminal arranged to receive a reset signal for resetting the input amplification unit. The latched comparator circuit further comprises a buffer unit 20 operatively connected to the first and the second output terminal of the input amplification unit. The buffer unit comprises a first and a second output terminal for outputting a first and a second output voltage of the buffer unit, respectively. In addition, the latched comparator circuit comprises a control unit operatively connected to the input amplification unit and the buffer unit. The control unit is adapted to generate the reset signal based on the first and the second output voltage of the buffer unit and a clock signal. Furthermore, the control unit is adapted to generate an output signal of the latched comparator circuit based on the first and the second output voltage of the buffer unit.

The input amplification unit may be adapted to balance the first and the second output voltage of the input amplification unit when the reset signal is in a first state. Furthermore, the input amplification unit may be adapted to generate the first and the second output voltage of the input amplification unit by amplifying a voltage difference between the first and the second input voltage when the reset signal is in a second state.

The buffer unit may comprise a clock terminal for receiving the clock signal. Moreover, the buffer unit may be adapted to precharge the first and the second output terminal of the buffer unit to a first voltage level when the clock signal is in a first state. Furthermore, the buffer unit may be adapted to selectively provide a conductive path to a node having a second voltage level from one of the first and the second output terminals of the buffer unit at least based on the first and the second output voltage of the input amplification unit when the clock signal is in a second state.

The control unit may be adapted to set the reset signal in the second state if the clock signal is in the second state and the absolute value of a difference between the first and the second output voltage of the buffer unit is smaller than a threshold value, or otherwise set the reset signal in the first state.

The control unit may be adapted to set the reset signal in the second state if the clock signal is in the second state and both of the absolute value of a difference between the first output voltage of the buffer unit and the first voltage level and the absolute value of a difference between the second output voltage of the buffer unit and the first voltage level is smaller than a threshold value, or otherwise, set the reset signal in the first state.

The control unit may comprise a first inverter having an input and an output terminal, wherein the input terminal of the first inverter is connected to the first output terminal of the buffer unit. Furthermore, the control unit may comprise a second inverter having an input and an output terminal, wherein the input terminal of the second inverter is connected to the second output terminal of the buffer unit.

The control unit may be adapted to generate the output signal of the latched comparator circuit as a differential signal at the output terminals of the first and the second inverter of the control unit.

The control unit may comprise a first logic gate having an output terminal, a first input terminal operatively connected to the output terminal of the first inverter of the control unit, and a second input terminal operatively connected to the output terminal of the second inverter of the control unit.

The control unit may comprise a second logic gate having an output terminal, a first input terminal arranged to receive the clock signal or a signal derived from the clock signal, and a second input terminal operatively connected to the output terminal of the first logic gate of the control unit. The control unit may be adapted to generate the reset signal or a signal from which the reset signal is to be derived at the output terminal of the second logic gate of the control unit.

The buffer unit may be adapted to provide said conductive path at least partly through the output terminals of the input amplification unit. The buffer unit may comprise a first MOS transistor connected to the first output terminal of the input amplification unit at its gate terminal, to the second output terminal of the input amplification unit at its source terminal, and to the first output terminal of the buffer unit at its drain terminal. The buffer unit may further comprise a second MOS transistor connected to the second output terminal of the input amplification unit at its gate terminal, to the first output terminal of the input amplification unit at its source terminal, and to the second output terminal of the buffer unit at its drain terminal.

The buffer unit may comprise a first switch device operatively connected between the first output terminal of the buffer unit and said node having the second voltage level. Furthermore, the buffer unit may comprise a second switch device operatively connected between the second output terminal of the buffer unit and said node having the second voltage level. The first and the second switch device of the buffer unit may be arranged to at least partly provide said conductive path in response to the output signal of the latched comparator circuit.

The buffer unit may comprise a third switch device operatively connected between the node having the second voltage level and the first and the second switch devices of the buffer unit. The third switch device may be adapted to be open if the clock signal is in the first state and closed if the clock signal is in the second state.

The buffer unit may comprise a fourth switch device operatively connected between the first output terminal of the buffer unit and a node having the first voltage level. The buffer unit may further comprise a fifth switch device operatively connected between the second output terminal of the buffer unit and said node having the first voltage level.

The fourth and the fifth switch device of the buffer unit may be adapted to be closed when the clock signal is in the first state for precharging the first and the second output terminal of the buffer unit to the first voltage level.

The buffer unit may be adapted to close the one of the fourth and the fifth switch devices that is operatively connected between the node having the first voltage level and the other one of the first and the second output terminals of the buffer unit based on the output signal of the latched comparator circuit, for maintaining the voltage at said other one of the first and the second output terminals of the buffer unit at the second voltage level.

The input amplification unit may comprise a differential transistor pair for receiving the first and the second input voltage of the latched comparator circuit.

The input amplification unit may comprise a cross-coupled pair of transistors operatively connected to the first and the second output terminal of the input amplification unit.

The input amplification unit may comprise a switch device operatively connected between the first and the second output terminal of the input amplification unit. The switch device of the input amplification unit may be adapted to be closed when the reset signal is in the first state and open when the reset signal is in the second state. The switch device of the input amplification unit may comprise at least one MOS transistor. The switch device of the input amplification unit may be a transmission gate.

One of the first and the second voltage levels may be a power-supply voltage of the buffer unit and the other one of the first and the second voltage levels may be 0 V.

According to a second aspect, an analog-to-digital converter comprises the latched comparator circuit according to the first aspect.

According to a third aspect, a memory circuit comprises the latched comparator circuit according to the first aspect.

According to a fourth aspect, an integrated circuit comprises the latched comparator circuit according to the first aspect.

According to a fifth aspect, an electronic apparatus comprises the latched comparator circuit according to the first aspect. The electronic apparatus may e.g. be, but is not limited to, any of a television set, a liquid-crystal display, a computer monitor, a digital camera, a projector, or a radio receiver.

According to a sixth aspect, a method of operating a latched comparator circuit is provided. According to the method, a first and a second input voltage of the latched comparator circuit are received on a first and a second input terminal, respectively, of an input amplification unit comprised in the latched comparator circuit. Furthermore, a first and a second output voltage of the input amplification unit are output on a first and a second output terminal, respectively, of the input amplification unit. In addition, a first and a second output voltage of a buffer unit comprised in the latched comparator circuit are output on a first and a second output terminal, respectively, of the buffer unit based on the first and the second output voltages of the input amplification unit. Moreover, a reset signal is generated based on the first and the second output voltage of the buffer unit and a clock signal. The reset signal is supplied to the input amplification unit for resetting the input amplification unit. Furthermore, an output signal of the latched comparator circuit is generated based on the first and the second output voltage of the buffer unit.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of the invention will appear from the following detailed description of the invention, reference being made to the accompanying drawings, in which.

DETAILED DESCRIPTION

Figure 1:
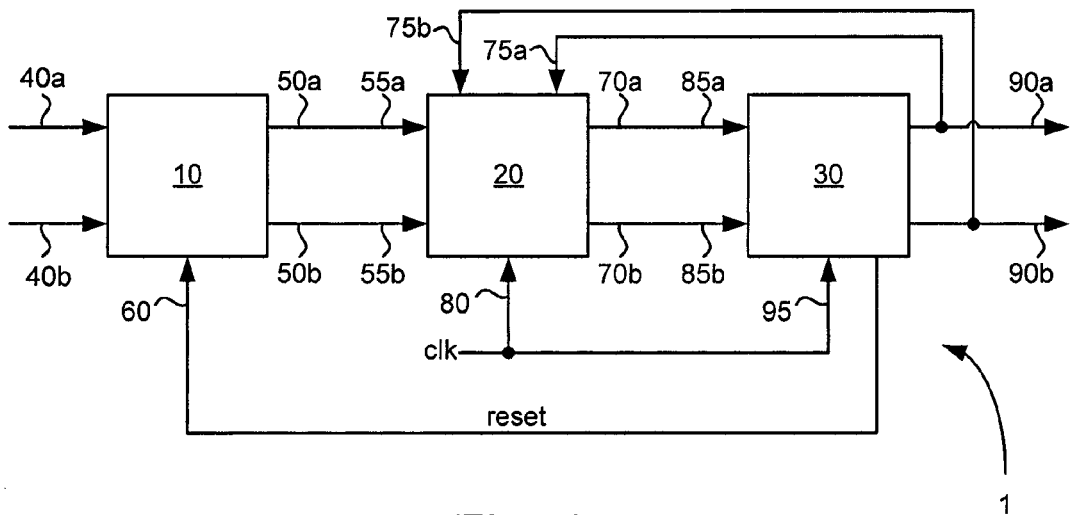
FIG. 1 is a block diagram of a latched comparator circuit according to an embodiment.

FIG. 1 is a block diagram of a latched comparator circuit 1 according to an embodiment. As illustrated in FIG. 1, the latched comparator circuit 1 may comprise an input amplification unit 10. Furthermore, the latched comparator circuit 1 may comprise a buffer unit 20 operatively connected to the input amplification unit 10. The latched comparator circuit 1 may further comprise a control unit 30 operatively connected to the input amplification unit 10 and the buffer unit 20.

According to the embodiment illustrated in FIG. 1, the input amplification unit 10 comprises a first input terminal 40a and a second input terminal 40b for receiving a first and a second input voltage of the latched comparator circuit 1, respectively. Furthermore, the input amplification unit 10 comprises a first output terminal 50a and a second output terminal 50b for outputting a first and a second output voltage of the input amplification unit 10, respectively. In addition, the input amplification unit comprises a reset terminal 60. The reset terminal 60 may be arranged to receive a reset signal for resetting the input amplification unit 10.

According to embodiments, the input amplification unit 10 is adapted to balance the first and the second output voltage of the input amplification unit 10 when the reset signal is in a first state. Furthermore, according to embodiments, the input amplification unit is adapted to generate the first and the second output voltage of the input amplification unit 10 by amplifying a voltage difference between the first and the second input voltage when the reset signal is in a second state. The first and the second state of the reset signal may e.g. be a logic '1' and a logic '0', respectively. Alternatively, the first and the second state of the reset signal may e.g. be a logic '0' and a logic '1', respectively. A logic '1' may e.g. be represented with a high voltage level, e.g. a supply voltage of the latched comparator circuit. A logic '0' may e.g. be represented with a low voltage level, e.g. 0 V.

According to the embodiment illustrated in FIG. 1, the buffer unit 20 comprises a first input terminal 55a operatively connected to the first output terminal 50a of the input amplification unit 10. Furthermore, the buffer unit 20 comprises a second input terminal 55b operatively connected to the second output terminal 50b of the input amplification unit 10. Moreover, the buffer unit 20 comprises a first output terminal 70a and a second output terminal 70b for outputting a first and a second output voltage of the buffer unit 20, respectively.

According to some embodiments, the buffer unit 20 comprises a clock terminal 80 for receiving a clock signal of the latched comparator circuit 1. The buffer unit 20 may be adapted to precharge the first output terminal 70a and the second output terminal 70b to a first voltage level when the clock signal is in a first state. When the clock signal is in a second state, one of the precharged output terminals 70a, 70b may be discharged based on the output voltages of the input amplification unit 10. For example, the buffer unit 20 may be adapted to selectively provide a conductive path to a node having a second voltage level from said one of the first and the second output terminals 70a, 70b of the buffer unit 20. The buffer unit 20 may be adapted to selectively provide said conductive path at least based on the first and the second output voltage of the input amplification unit 10. The first and the second state of the clock signal may e.g. be a logic '1' and a logic '0', respectively. Alternatively, the first and the second state of the clock signal may e.g. be a logic '0' and a logic '1', respectively. A logic '1' may e.g. be represented with a high voltage level, e.g. a supply voltage of the latched comparator circuit 1. A logic '0' may e.g. be represented with a low voltage level, e.g. 0 V.

The first voltage level may e.g. be a supply voltage of the buffer unit 20 and the second voltage level may e.g. be 0 V. Alternatively, first voltage level may e.g. be a 0 V and the second voltage level may e.g. be a supply voltage of the buffer unit 20. Other voltage levels are possible within the scope of the invention, as long as the first and second voltage levels are different. One of the first and the second voltage levels may represent a logic '1' and the other a logic '0'. According to embodiments, the buffer unit 20 is operative, in conjunction with the input amplification unit 10, to determine whether the first input voltage of the latched comparator circuit 1 is larger than the second input voltage of the latched comparator circuit 1 or vice versa. A result of that determination is generated as a voltage difference between the output terminals 70a and 70b of the buffer unit 20.

According to the embodiment illustrated in FIG. 1, the control unit 30 comprises a first input terminal 85a operatively connected to the first output terminal 70a of the buffer unit 20. Furthermore, the control unit 30 comprises a second input terminal 85b operatively connected to the second output terminal 70b of the buffer unit 20. Moreover, the control unit 30 comprises a clock terminal 95 for receiving the clock signal.

According to embodiments, the control unit 30 is adapted to generate the reset signal based on the first and the second output voltage of the buffer unit 20 and the clock signal. This is indicated in FIG. 1, where the control unit 30 is operatively connected to the reset terminal 60 of the input amplification unit 10. Furthermore, the control unit 30 may be adapted to generate an output signal of the latched comparator circuit 1 based on the first and the second output voltage of the buffer unit 20. For example, in the embodiment illustrated in FIG. 1, the control unit 30 comprises a first output terminal 90a and a second output terminal 90b for outputting the output signal as a differential output voltage. According to some embodiments, a single-ended output may be used. Moreover, in some embodiments, the output signal of the latched comparator circuit 1 may be fed back to the buffer unit 20, e.g. for controlling parts internally in the buffer unit 20. This is illustrated in FIG. 1, wherein the output terminals 90a and 90b of the control unit are operatively connected to control terminals 75a and 75b, respectively, of the buffer unit 20.

Figure 2:
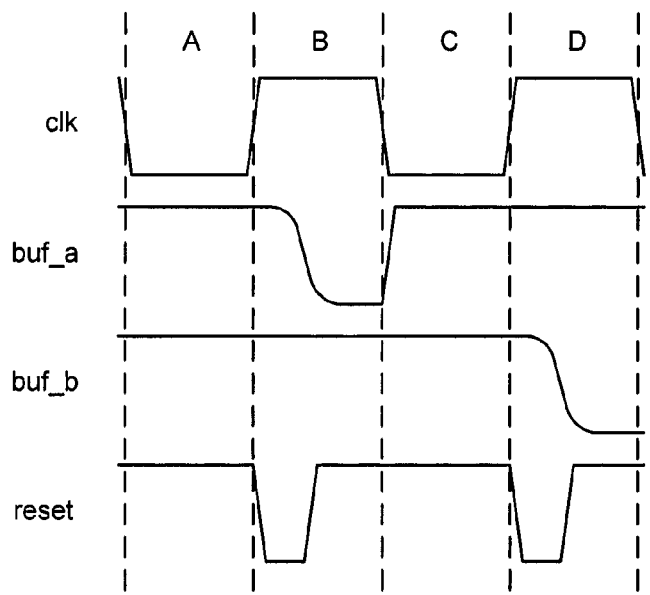
FIG. 2 is a diagram schematically showing exemplary signals of a latched comparator circuit.

In FIG. 2, exemplary diagrams of signals of the latched comparator circuit 1 are sketched for illustrating the generation of the reset signal according to some embodiments. In the example of FIG. 2, the clock signal is labeled "clk", and the second state of the clock signal is represented with a higher voltage than the first state. Furthermore, the first and second output voltages of the buffer unit 20 are labeled "buf_a" and "buf_b", respectively, and the first voltage level is higher than the second voltage level. Moreover, the reset signal is labeled "reset", and the first state of the reset signal is represented with a higher voltage than the second state.

In the following, reference will be made to four clock phases shown in the example of FIG. 2, labeled A, B, C, and D. Furthermore, reference will be made to a first and a second clock period of the example in FIG. 2. The first clock period comprises the clock phases A and B. The second clock period comprises the clock phases C and D.

During clock phase A, the clock signal is in the first state. In response thereto, the output terminals 70a, 70b of the buffer unit are precharged to the first voltage level and the reset signal is in the first state. In the transition from clock phase A to clock phase B, the clock signal makes a transition from the first to the second state of the clock signal. In response thereto, the reset signal makes a transition from the first to the second state of the reset signal. Then, the input amplification unit 10 and the buffer unit 20 are operative to determine whether the first input voltage of the latched comparator circuit 1 is higher than the second input voltage or vice versa. For the first clock period in the example, the relation between the input voltages of the latched comparator circuit is such that the first output terminal 70*a* is discharged via a conductive path to a node having the second voltage level. When the buf_a voltage has changed sufficiently, e.g. decreased more than a certain threshold, the control unit 30 may detect that a determination has been made by the input amplification unit 10 and the buffer unit 20. In response thereto, the control unit 30 may set the reset signal in the first state, whereby the input amplification unit 10 is reset. The result of the determination is held, or latched, by the buffer unit 20 for the remainder of clock phase B as illustrated in FIG. 2.

In the transition between the first and the second clock period, the clock signal makes a transition from the second to the first state of the clock signal. In response thereto, the output terminals 70*a*, 70*b* of the buffer unit 20 are precharged to the first voltage level. In the transition from clock phase C to clock phase D, the clock signal makes a transition from the first to the second state of the clock signal. In response thereto, the reset signal makes a transition from the first to the second state of the reset signal. Then, the input amplification unit 10 and the buffer unit 20 are operative to determine whether the first input voltage of the latched comparator circuit 1 is higher than the second input voltage or vice versa. For the second clock period in the example, the relation between the input voltages of the latched comparator circuit is such that the second output terminal 70*b* is discharged via a conductive path to a node having the second voltage level. When the buf_b voltage has changed sufficiently, e.g. decreased more than a certain threshold, the control unit 30 may detect that a determination has been made by the input amplification unit 10 and the buffer unit 20. In response thereto, the control unit 30 may set the reset signal in the first state, whereby the input amplification unit is reset. The result of the determination is held, or latched, by the buffer unit 20 for the remainder of clock phase D as illustrated in FIG. 2.

As can be readily seen from the foregoing example, generating the reset signal based on the clock signal and the first and the second output voltage of the buffer unit 20 has the benefit that the reset signal can be set in the first state of the reset signal before the clock signal has made the transition to the first state of the clock signal. Thereby, the input amplification unit 10 may be reset before the clock signal makes the transition to the first state of the clock signal. Hence, a larger fraction of the clock cycle may be used for resetting the input amplification unit 10 compared with if the reset is only performed in the first state of the clock signal. A consequence thereof is that the latched comparator circuit 1 may operate at a higher clock frequency e.g. compared with if the reset is based only on the clock signal.

A further advantage of generating the reset signal based on the clock signal and the first and the second output voltage of the buffer unit 20 is that the operation of the latched comparator circuit 1 is less dependent on the duty cycle of the clock signal e.g. compared with if the reset is based only on the clock signal. Thereby, the requirements on the duty cycle of the clock signal may be relaxed.

According to some embodiments, the input voltages of the latched comparator circuit 1 may be supplied by a preamplifier (not shown in the Figures) operatively connected to the input terminals 40*a* and 40*b* of the input amplification unit 10. The input voltages to the latched comparator circuit 1 may be generated by the preamplifier by amplification of input voltages to the preamplifier. The preamplifier may be a resettable preamplifier. Shortly after the clock signal has made a transition from the first to the second state, a reset pulse may be supplied to the preamplifier for resetting the preamplifier in preparation for a subsequent comparison. The reset of the input amplification unit 10 will, in such an arrangement, cause disturbances in the preamplifier, e.g. due to capacitive and/or inductive on-chip coupling. The preamplifier may generally be less susceptible to such disturbances during the reset of the preamplifier than when it is operative to amplify its input voltages in order to generate the input voltages to the latched comparator circuit 1. An advantage of generating the reset signal based on the clock signal and the first and the second output voltage of the buffer unit 20, e.g. compared with if the reset is based only on the clock signal, is that the reset of the input amplification unit 10 may be initiated while the preamplifier is still being reset, i.e. while it is less susceptible to disturbances due to the reset of the input amplification unit 10. Thereby, cleaner, or less distorted, input voltages may be provided to the input amplification unit 10.

According to some embodiments, the control unit 30 is adapted to sense a voltage difference between the first and the second output voltage of the buffer unit 20. The control unit 30 may further be adapted to set the reset signal in the second state in response to that the clock signal is in the second state and the absolute value of said voltage difference is smaller than a threshold value. Otherwise, i.e. in response to that the clock signal is in the first state or said absolute value is larger than or equal to the threshold value, the control unit may be adapted set the reset signal in the first state of the reset signal.

According to some embodiments, the control unit 30 is adapted to sense a first voltage difference between the first output voltage of the buffer unit 20 and the first voltage level. Furthermore, the control unit 30 is adapted to sense a second voltage difference between the second output voltage of the buffer unit 20 and the first voltage level. The control unit 30 may be adapted to set the reset signal in the second state in response to that the clock signal is in the second state and both of the absolute value of said first voltage difference and the absolute value of a said second voltage difference are smaller than a threshold value. Otherwise, i.e. in response to that the clock signal is in the first state or either of said absolute values is larger than or equal to the threshold value, the control unit may be adapted set the reset signal in the first state of the reset signal.

Sensing said first voltage difference between the first output voltage of the buffer unit 20 and the first voltage level may be accomplished by means of an inverter receiving the first output voltage of the buffer unit 20 at its input. The inverter may be adapted to generate an output signal that makes a transition from a first logic state (e.g. '0' or '1') to a second logic state (e.g. '1' or '0') when the voltage at its input passes through a trip voltage of the inverter. The trip voltage may be selected to correspond to a given voltage difference between the first output voltage of the buffer unit 20 and the first voltage level, such as said threshold value. Designing inverters for a given trip voltage is well known in the art and will not be further described herein. In the same way, sensing said second voltage difference between the second output voltage of the buffer unit 20 and the first voltage level may be accomplished by means of an inverter receiving the second output voltage of the buffer unit 20 at its input.

According to alternative embodiments, other units than inverters may be used for sensing the first/second voltage difference. For example, a two input NAND, NOR, AND or OR gate having both input terminals connected to the first/second output terminal 70a/70b of the buffer unit 20 may be used. Alternatively, a two input NAND or AND gate with one input terminal connected to the first/second output terminal 70a/70b of the buffer unit 20a and the other input terminal set to a logic '1' may be used. Further alternatively, a two input NOR or OR gate with one input terminal connected to the first/second output terminal 70a/70b of the buffer unit 20a and the other input terminal set to a logic '0' may be used. Other logic gates, with an arbitrary number of inputs, may also be used within the scope of the invention. Other types of circuitry, such as amplifiers or Schmitt-triggers with suitable transfer characteristic may also be employed.

Figure 3A:
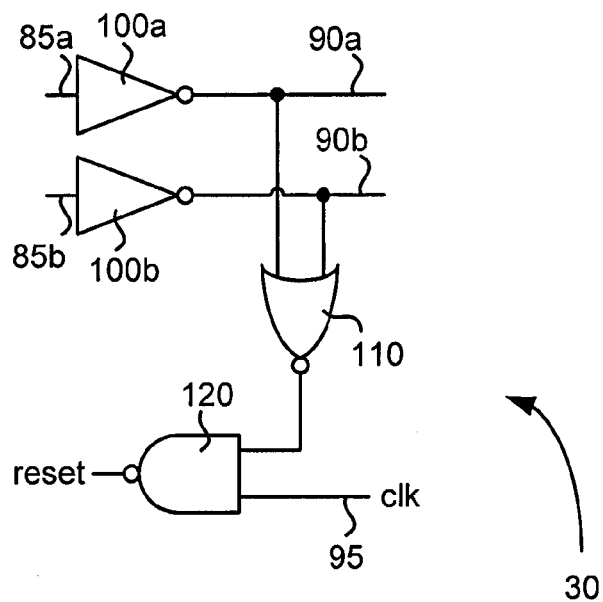
FIGS. 3a-b are a circuit diagrams of a control unit according to embodiments.

FIG. 3a is a circuit diagram of the control unit 30 according to an embodiment. A first inverter 100a of the control unit 30 has its input terminal connected to the first input terminal 85a of the control unit 30 for receiving the first output voltage of the buffer unit 20. The first inverter 100a may be utilized to detect when the first output voltage of the buffer unit 20 passes through a trip voltage of the first inverter 100a, and thereby, to detect when the absolute value of a voltage difference between the first output voltage of the buffer unit 20 and the first voltage level exceeds or equals a threshold value. Furthermore, a second inverter 100b of the control unit 30 has its input terminal connected to the second input terminal 85b of the control unit 30 for receiving the second output voltage of the buffer unit 20. The second inverter 100b may be utilized to detect when the second output voltage of the buffer unit 20 passes through a trip voltage of the second inverter 100b, and thereby, to detect when the absolute value of a voltage difference between the second output voltage of the buffer unit 20 and the first voltage level exceeds or equals a threshold value.

The control unit 30 may be adapted to generate the output signal of the latched comparator circuit 1 as a differential signal at the output terminals of the first and the second inverter 100a, 100b of the control unit 30. This is indicated in FIG. 3, where the output terminals of the inverters 100a and 100b are connected to the output terminals 90a and 90b, respectively, of the control unit 30. Alternatively, the output terminal of any of the inverters 100a and 100b may be utilized as a single-ended output of the latched comparator circuit.

According to the embodiment illustrated in FIG. 3a, the control unit 30 comprises a first logic gate 110. The first logic gate 110 has an output terminal, a first input terminal operatively connected to the output terminal of the first inverter 100a, and a second input terminal operatively connected to the output terminal of the second inverter 100b. The first logic gate 110 is operative to detect a change in logic state at the output of any the inverters 100a and 100b and, thereby, detect if the input amplification unit 10 and the buffer unit 20 has determined whether the first input voltage of the latched comparator circuit 1 is higher than the second input voltage or vice versa.

In the embodiment illustrated in FIG. 3a, the first logic gate 110 is a NOR gate. A NOR gate is suitable if the first voltage level, i.e. the voltage level to which the output terminals 70a and 70b of the buffer unit 20 are precharged, is a "high" voltage level corresponding to a logic '1'. This is e.g. the case for the exemplary waveforms sketched in FIG. 2. As long as the input signals to the inverters 100a and 100b are high (or '1'), the output signals form the inverters 100a and 100b are low (or '0'). Hence, the output signal of the NOR gate 110 is '1'. When the input voltage to one of the inverters 100a and 100b passes through the trip voltage of the inverter, the output signal of that inverter changes to '1'. In response thereto, the output signal of the NOR gate 110 changes to '0'. Other logic gates than a NOR gate may be used as the logic gate 110. For example, an OR gate, XOR gate or XNOR gate may be used when the first voltage level is a high voltage level. Alternatively, if the first voltage level is a "low" voltage level, i.e. corresponding to a logic '0', an AND gate, NAND gate, XOR gate, or XNOR gate may e.g. be used.

According to the embodiment illustrated in FIG. 3a, the control unit 30 further comprises a second logic gate 120. The second logic gate 120 has a first input terminal arranged to receive the clock signal. Furthermore, the second logic gate 120 has a second input terminal operatively connected to the output terminal of the first logic gate 110. The second logic gate 120 is arranged to combine the clock signal and the output signal of the first logic gate 110 for generating the reset signal. Alternatively, according to some embodiments, the reset signal may be derived, e.g. by means of buffering, inversion, etc., from the output signal of the second logic gate 120.

According to some embodiments, the second logic gate may be arranged to receive a signal derived from the clock signal rather than receiving the clock signal directly. For example, the signal derived from the clock signal may be derived e.g. by means of buffering, inversion, etc.

In the embodiment illustrated in FIG. 3a, the second logic gate 120 is a NAND gate. When both the clock signal and the output signal of the NOR gate 110 are '1', the output of the NAND gate 120 is '0'. When either or both of the clock signal and the output signal of the NOR gate 110 is/are '0', the output of the NAND gate 120 is '1'. Hence, a NAND gate is suitable as the second logic gate 120 for generating the reset signal in accordance with the waveform examples sketched in FIG. 2. In other embodiments, another type of logic gate, such as but not limited to an AND gate, NOR, gate or OR gate, may be suitable, e.g. depending on which type of logic gate that is used as the first logic gate 110, the first and second voltage levels, and voltage levels used for representing the first and second states of the clock signal and the reset signal. Selecting an appropriate type of logic gate as the second logic gate 120 based on these circumstances is a straight-forward task for a person skilled in the art and will not be further described herein.

A joint functionality of the first logic gate 110 and second logic gate 120 is to generate the reset signal or a signal from which the reset signal may be derived based on the output signals of the inverters 100a and 100b and the clock signal. According to some embodiments, said joint functionality may be implemented with a single logic gate. Designing a logic gate for a given logic function is well known in the art and will not be further described herein.

Figure 3B:
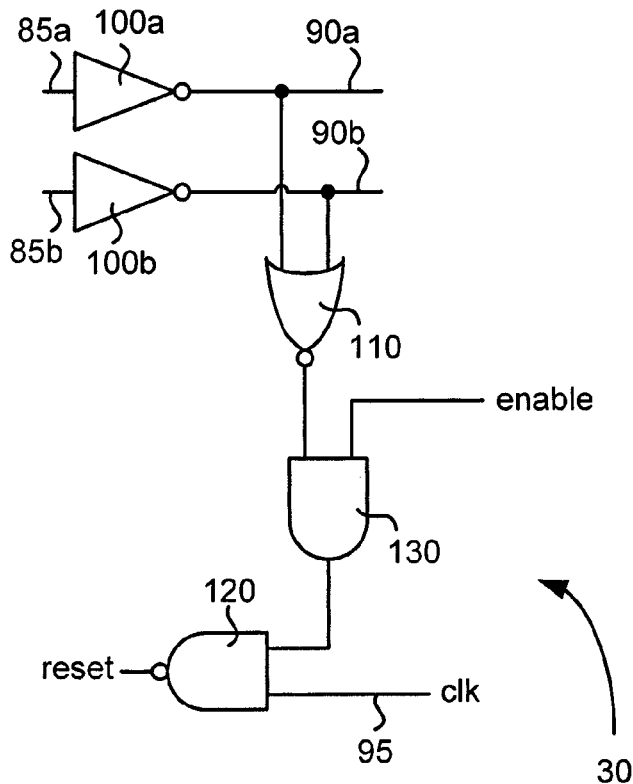

FIG. 3b shows a circuit diagram of the control unit 30 according an alternative embodiment. In FIG. 3b, the operative connection between the first logic gate 110 and the second logic gate 120 is provided via a third logic gate 130. In the embodiment illustrated in FIG. 3b, the third logic gate 130 is an AND gate. The AND gate 130 is arranged to receive an enable signal (not shown in FIG. 1) of the latched comparator circuit 1. When the enable signal is '1', the operation of the control unit is the same as for the embodiment illustrated in FIG. 3a. When the enable signal is '0', the reset signal is set to '0' independently of the clock signal and the output signal of the first logic gate 110.

Figure 4A:
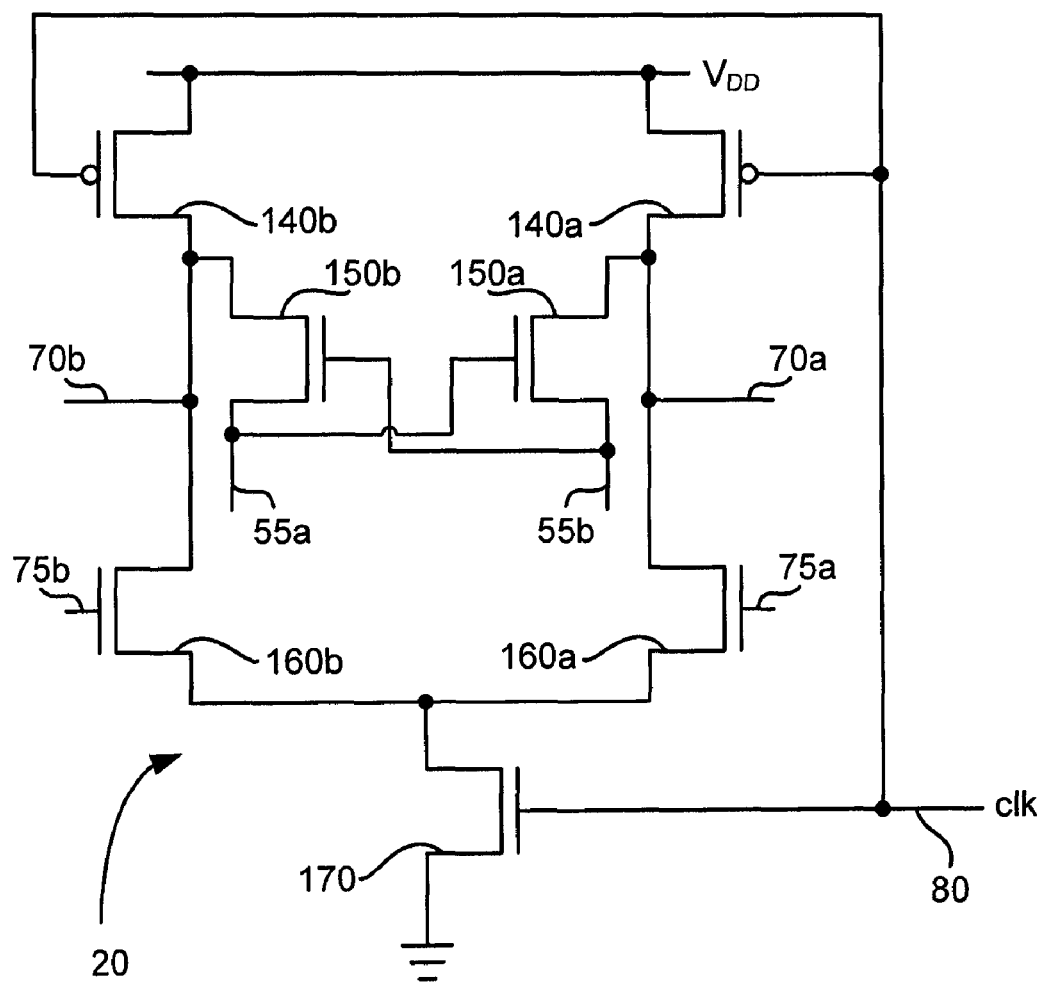
FIGS. 4a-d are circuit diagrams of a buffer unit according to embodiments.

The buffer unit 20 may be adapted to provide the conductive path between one of the first and the second output terminals 70a, 70b at least partly through the output terminals of the input amplification unit 10. FIG. 4a shows a circuit diagram of the buffer unit 20 according to an embodiment. The embodiment of the buffer unit 20 illustrated in FIG. 4a is suitable for operation e.g. in conjunction with the control unit 30 according to the embodiments illustrated in FIG. 3a and FIG. 3b. According to the embodiment, the buffer unit 20 comprises a first MOS transistor 150a connected to the first input terminal 55a of the buffer unit 20 at its gate terminal. Furthermore, the first MOS transistor 150a is connected to the second input terminal 55b of the buffer unit 20 at its source terminal. Moreover, the first MOS transistor 150a is connected to the first output terminal 70a of the buffer unit 20 at its drain terminal. In addition, the buffer unit 20 comprises a second MOS transistor 150b connected to the second input terminal 55b of the buffer unit 20 at its gate terminal. The second MOS transistor 150b is further connected to the first input terminal 55a of the buffer unit 20 at its source terminal. Moreover, the second MOS transistor 150b is connected to the second output terminal 70b of the buffer unit 20 at its drain terminal.

As described in the context of FIG. 1, the buffer unit 20 is arranged to receive the first and second output voltages of the input amplification unit 10 at the first input terminal 55a and the second input terminal 55b, respectively, of the buffer unit 20. When the input amplification unit 10 is reset by setting the reset signal in the first state, the output voltages of the input amplification unit 10 are forced to be equal (or nearly equal). Neglecting subthreshold currents, both of the first and the second MOS transistors 150a and 150b, will therefore be in a nonconductive state. On the other hand, when the reset signal is in the second state, a difference between the output voltages of the input amplification unit 10 is developed. When this voltage difference is larger than a transistor threshold voltage of the first and the second MOS transistors 150a, 150b, one of the first and the second MOS transistors will enter a conductive state. Thereby, a conductive path may be formed through that MOS transistor from one of the first and the second output terminals 70a, 70b of the buffer unit 20 via an output terminal of the input amplification unit 10 to a node having the second voltage level.

According to the embodiment illustrated in FIG. 4a, the buffer unit 20 comprises a number of switch devices 140a, 140b, 160a, 160b, 170. As illustrated in FIG. 4a, these switch devices may be implemented with MOS transistors.

Switch devices 140a and 140b are connected between a supply voltage terminal (labeled $V_{DD}$) and the first and second output terminal 70a, 70b, respectively, of the buffer unit 20. The switch device 170 is operatively connected in the path between a ground terminal and the output terminals 70a and 70b. In this embodiment, the first voltage level is said supply voltage of the buffer unit 20. Furthermore, the second voltage level is 0 V, or ground. In the embodiment of FIG. 4a, the switch devices 140a, 140b, and 170 are controlled by the clock signal. When the clock signal is in the first state of the clock signal, the switch devices 140a and 140b are closed. Thereby, conductive paths to the supply voltage terminal are formed from the output terminals 70a, 70b of the buffer unit 20. Also, when the clock signal is in the first state, the switch device 170 is open and the MOS transistors 150a and 150b are in a nonconductive state, since the input amplification unit 10 is reset. As a consequence, the output terminals 70a and 70b of the buffer unit 20 are precharged to the supply voltage.

The switch devices 160a and 160b are connected between the switch device 170 and the output terminals 70a and 70b, respectively, of the buffer unit 20. The switch devices 160a and 160b are controlled by the output signal of the latched comparator unit 1 via the control terminals 75a and 75b of the buffer unit 20. When the clock signal is in the first state, both the first and the second output voltages of the buffer unit 20 are high. As a consequence, the output signals of the inverters 100a and 100b (FIG. 3a and FIG. 3b) are both '0'. In response thereto, both switch devices 160a and 160b are open.

When the clock signal enters the second state of the clock signal, the switch devices 140a and 140b are opened, and the switch device 170 is closed. Furthermore, the reset signal enters the second state of the reset signal, and a voltage difference is allowed to be developed between the output terminals 50a and 50b of the input amplification unit 10 based on the first and the second input voltages of the latched comparator circuit 1. In response thereto, a discharge is commenced of either the first output terminal 70a or the second output terminal 70b of the buffer unit 20. When the voltage at the output terminal 70a or 70b being discharged passes through the trip voltage of the inverter 100a or 100b (FIG. 3a and FIG. 3b), the output signal of that inverter changes to '1'. In response thereto, the reset signal enters the first state of the reset signal. As a consequence, the output voltages of the input amplification unit 10 are balanced, and the MOS transistors 150a and 150b are both set in a nonconductive state. Hence, the conductive path provided from one of the output terminals 70a and 70b of the buffer unit 20 via one of the MOS transistors 150a and 150b, is broken. However, the one of the switch devices 160a and 160b that is connected to the output terminal 70a and 70b of the buffer unit 20 that is being discharged is closed. Thereby, a conductive path to ground from said output terminal 70a or 70b of the buffer unit is maintained via said switch device 160a or 160b and the switch device 170. Thereby, the output voltage of that output terminal 70a or 70b of the buffer unit 20 is pulled to and statically held at 0 V, whereby accidental charging of said output terminal 70a or 70b, e.g. due to leakage, is avoided.

In the embodiment illustrated in FIG. 4a, the switch devices 140a, 140b are implemented with PMOS transistors and the switch devices 160a, 160b, and 170 are implemented with NMOS transistors. Other implementations are also possible. For example, a complementary solution wherein all NMOS transistors in FIG. 4a are replaced with PMOS transistors, all PMOS transistors in FIG. 4a are replaced with NMOS transistors, and all connections to ground and the supply voltage are interchanged, is also possible within the scope of the invention. Then, the first voltage level is 0 V and the second voltage level is the supply voltage of the buffer unit 20. Appropriate modifications, e.g. in term of choosing appropriate logic gate types as described in the context of FIG. 3a and FIG. 3b, should in that case be made to the control unit 30. Furthermore, the first state of the clock signal should be represented with a higher voltage than the second state of the clock signal, i.e. have an inverted waveform compared with the clock waveform in FIG. 2.

Figure 4B:
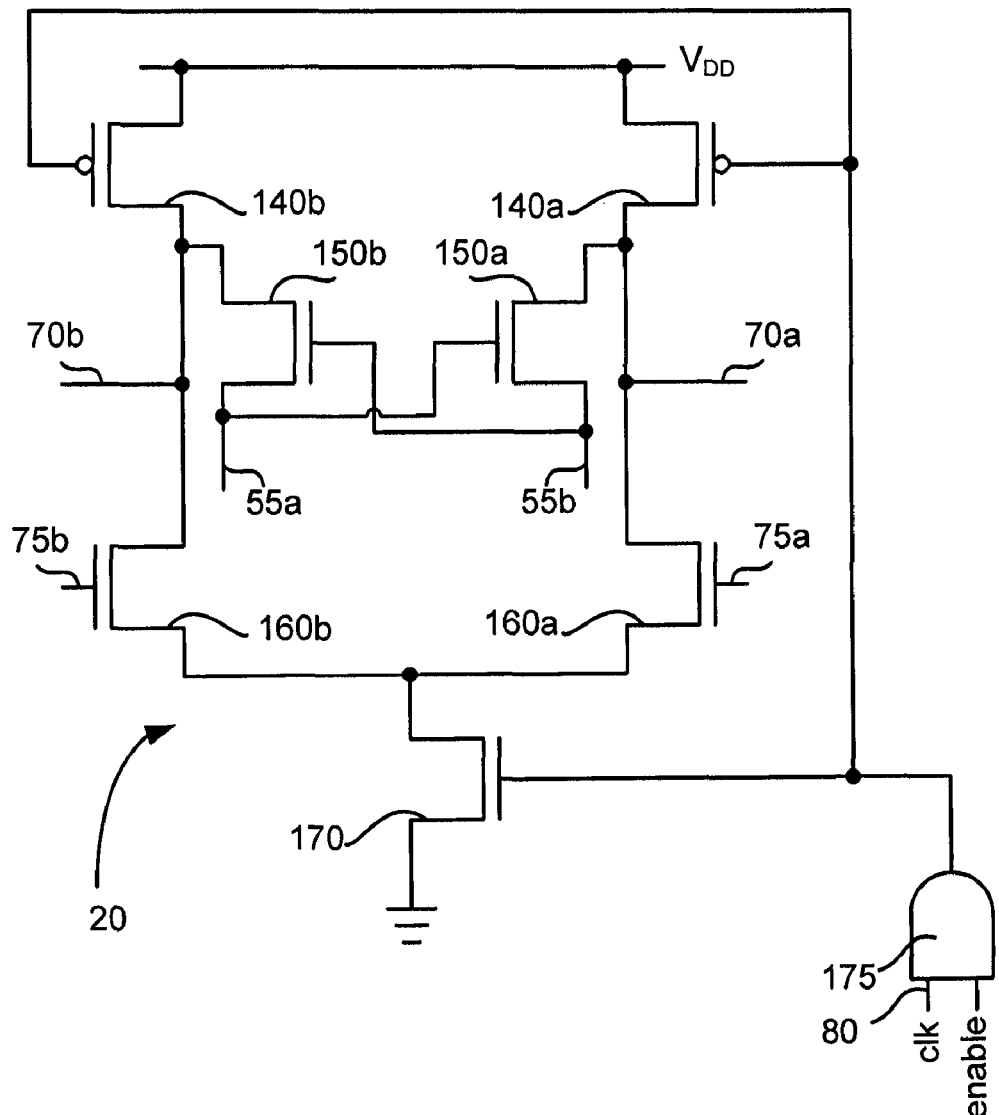

FIG. 4b is a circuit diagram of another embodiment of the buffer unit 20. According to the embodiment, the buffer unit 20 comprises a logic gate 175. According to the embodiment illustrated in FIG. 4b, the logic gate 175 is an AND gate. The AND gate 175 is arranged to receive the clock signal at a first input terminal and an enable signal (not shown in FIG. 1) at a second input terminal. When the enable signal is '1', the AND gate 175 forwards the clock signal to the switch devices 140a, 140b and 170. Then, the buffer unit 20 is operable in accordance with the embodiment of FIG. 4a. However, when the enable signal is '0', the output of the AND gate 175 is set to '0' independently of the clock signal, and the buffer unit 20 is disabled. Other gates than an AND gate, e.g. a NAND gate, OR gate, or NOR gate may also by used if the signal representations for the enable signal and/or the clock signal are appropriately modified.

Figure 4C:
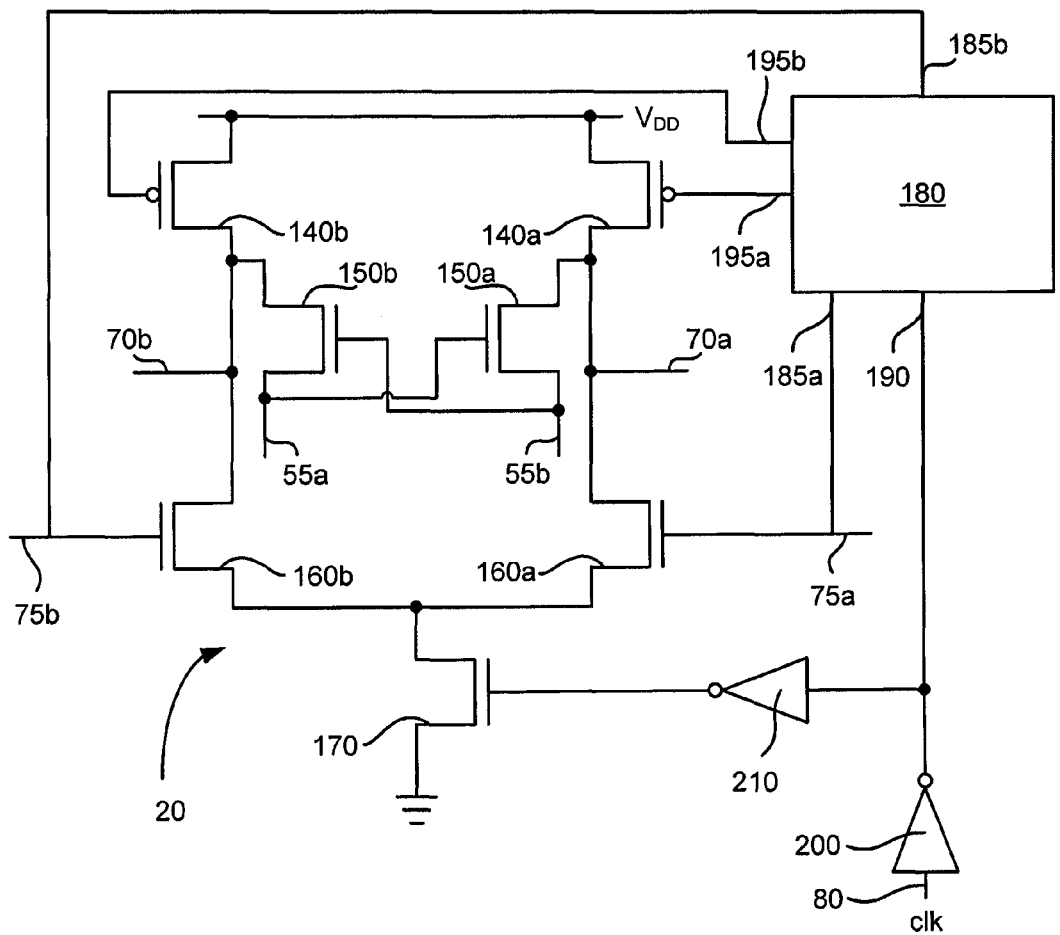

FIG. 4c is a circuit diagram of the buffer unit 20 according to another embodiment. In this embodiment, the switch devices 140a and 140b are not directly controlled by the clock signal. Instead, a switch-control unit 180 controls the switches 140a and 140b based on the clock signal and the output signal of the latched comparator circuit 1. In FIG. 4c, the switch-control unit 180 is arranged to receive an inverted clock signal from an inverter 200. The switch device 170 is operatively connected to the clock terminal 80 of the buffer unit 20 via the inverter 200 and another inverter 210. In other embodiments, the switch-control unit 180 and/or the switch device 170 may be directly connected to the clock terminal 80 of the buffer unit 20. Furthermore, the switch-control unit 180 is connected to the control terminals 75a and 75b at terminals 185a and 185b, respectively, and to the switch devices 140a and 140b at terminals 195a and 195b, respectively, for providing control signals to the switch devices 140a and 140b.

When the clock signal is in the first state, the switch-control unit 180 generates the control signals to the switch devices 140a and 140b, such that these switch devices 140a and 140b are closed for precharging the output terminals 70a and 70b of the buffer unit 20. When the clock signal enters the second state, the switch-control unit 180 initially generates the control signals to the switch devices 140a and 140b such that these switch devices 140a and 140b are opened. As a voltage difference is developed between the first and the second output terminal 50a and 50b of the input amplification unit 10, a discharge of one of the output terminals 70a and 70b of the buffer unit 20 is commenced. When the voltage at that output terminal 70a or 70b of the buffer unit 20 passes through the trip voltage of the inverter 100a or 100b (FIG. 3a and FIG. 3b) connected to said output terminal 70a or 70b, the output signal of that inverter 100a or 100b makes a transition from '0' to '1'. In response thereto, the switch-control unit 180 generates the control signals to the switches 140a and 140b such that the one of the switches that is connected to the other one of the output terminals 70a and 70b (i.e. the output terminal that is not being discharged) of the buffer unit 20 is closed. Thereby, the voltage at said other one of the output terminals 70a and 70b is statically held at the first voltage level (in FIG. 4c, the supply voltage) and accidental discharge, e.g. through leakage, may be avoided.

Figure 4D:
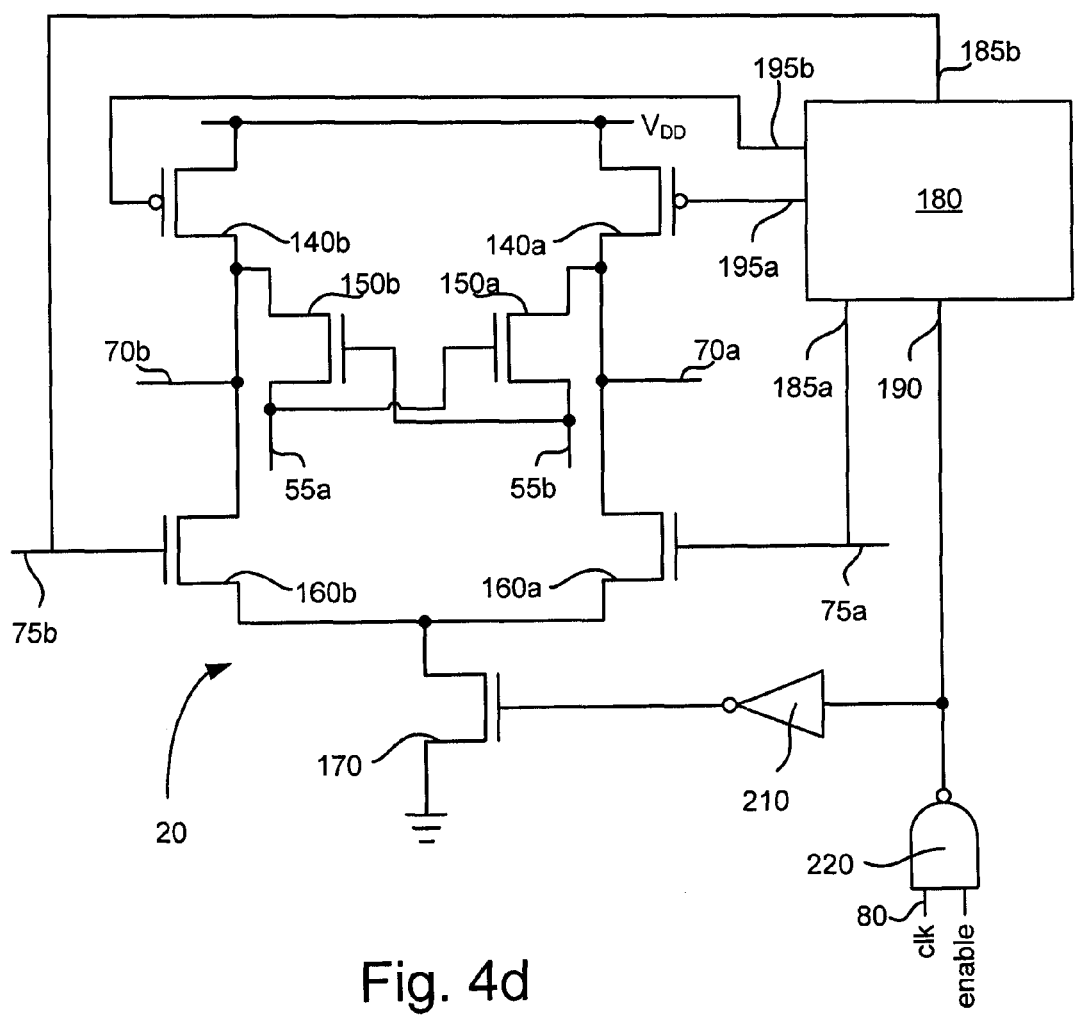

FIG. 4d is a circuit diagram of the buffer unit 20 according to another embodiment. According to this embodiment, the inverter 200 in FIG. 4c is replaced with a logic gate 220 arranged to receive the clock signal at a first input terminal and an enable signal at the second input terminal. In FIG. 4d, the logic gate 220 is a NAND gate. When the enable signal is '1', the NAND gate 220 forwards the inverse of the clock signal to the terminal 190 of the switch-control unit 180 and the inverter 210. Then, the buffer unit 20 is operable in accordance with the embodiment of FIG. 4c. However, when the enable signal is '0', the output of the NAND gate 220 is set to '1' independently of the clock signal, and the buffer unit 20 is disabled. Other gates than a NAND gate, e.g. an AND gate, OR gate, or NOR gate may also by used if the signal representations for the enable signal and/or the clock signal are appropriately modified.

Figure 5:
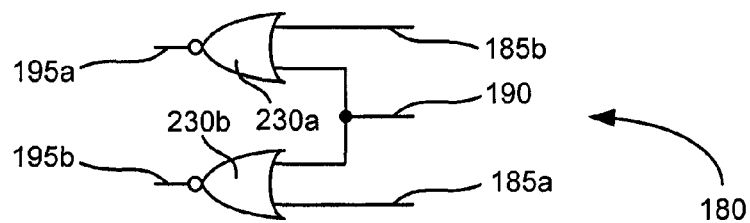
FIG. 5 is a circuit diagram of a part of a buffer unit according to an embodiment.

FIG. 5 is a circuit diagram of the switch-control unit 180 of FIG. 4c and FIG. 4d according to an embodiment. According to the embodiment, the switch-control unit 180 comprises two NOR gates 230a and 230b. The NOR gate 230a has a first input terminal arranged to receive the inverse of the clock signal and a second input terminal arranged to be operatively connected to the second output terminal 90b of the control unit 30 via the terminal 185b of the switch-control unit 180. Furthermore, the NOR gate 230b has a first input terminal arranged to receive the inverse of the clock signal and a second input terminal arranged to be operatively connected to the first output terminal 90a of the control unit 30 via the terminal 185a of the switch-control unit 180. When either or both of the inverse of the clock signal and the signal at terminal 185b are high, the output signal of the NOR gate 230a is low, thereby setting the PMOS transistor 140a (FIG. 4c and FIG. 4d) in a conductive, or closed, state. Otherwise, the output signal of the NOR gate 230b is high, thereby setting the PMOS transistor 140a (FIG. 4c and FIG. 4d) in a nonconductive, or open, state. Similarly, when either or both of the inverse of the clock signal and the signal at terminal 185a are high, the output signal of the NOR gate 230b is low, thereby setting the PMOS transistor 140b (FIG. 4c and FIG. 4d) in a conductive, or closed, state. Otherwise, the output signal of the NOR gate 230b is high, thereby setting the PMOS transistor 140b (FIG. 4c and FIG. 4d) in a nonconductive, or open, state.

Figure 6:
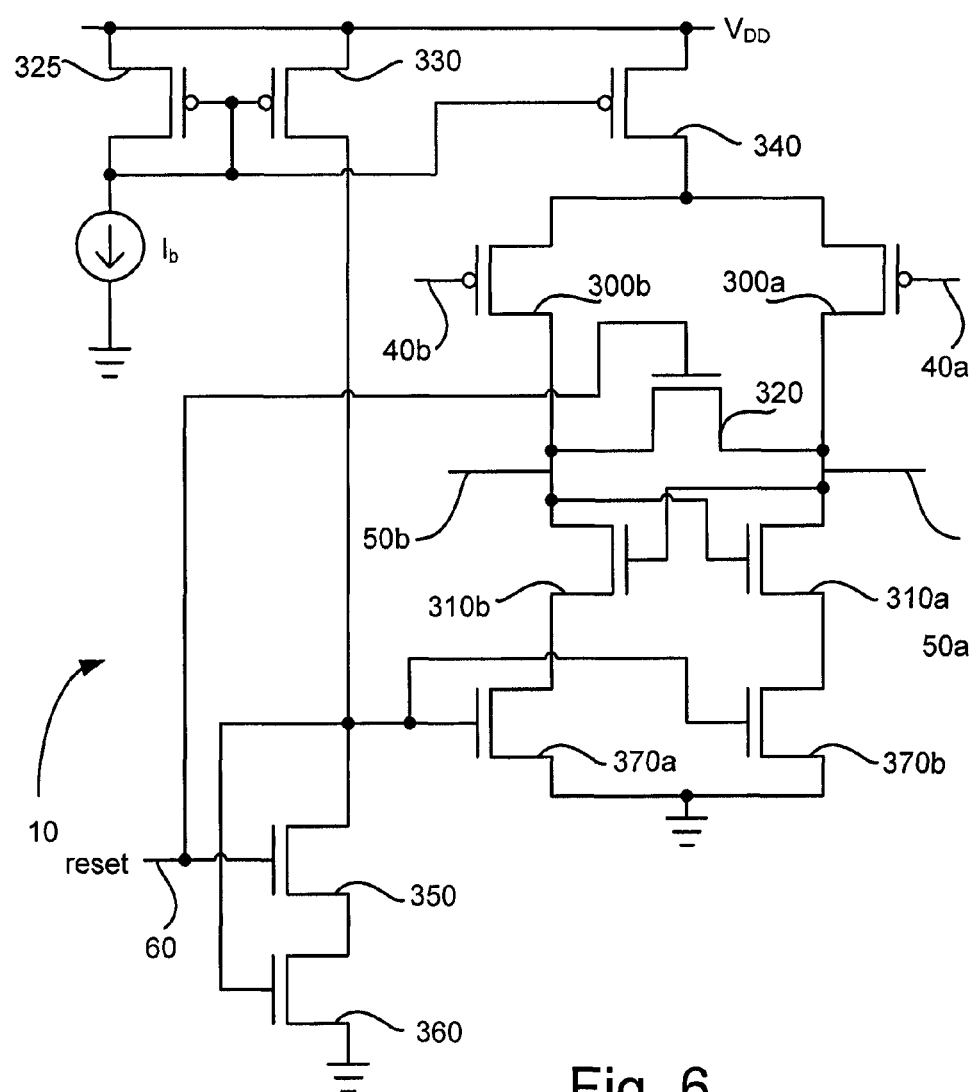
FIG. 6 is a circuit diagram of an input amplification unit according to an embodiment.

FIG. 6 shows a circuit diagram of the input amplification unit 10 according to an example embodiment. The input amplification unit 10 according to this embodiment is suitable for operation together with the embodiments of the control unit 30 illustrated in FIG. 3a and FIG. 3b and the embodiments of the buffer unit 20 illustrated in FIG. 4a-d. For the embodiment of FIG. 6, the first state of the reset signal is represented with a high voltage, such as a supply voltage of the latched comparator circuit 1. Furthermore, the second state of the reset signal is represented with a low voltage, e.g. 0 V, or ground.

According to the embodiment, the input amplification unit 10 comprises a differential transistor pair 300a, 300b. The differential transistor pair comprises two PMOS transistors 300a and 300b. The gate terminal of the PMOS transistor 300a and the PMOS transistor 300b are connected to the input terminal 40a and the input terminal 40b, respectively, of the input amplification unit 10. Thereby, the differential transistor pair is arranged to receive the first and the second input voltage of the latched comparator circuit 1.

Furthermore, according to the embodiment, the input amplification unit 10 comprises a cross-coupled pair of transistors 310a, 310b. The cross-coupled pair of transistors 310a, 310b is operatively connected between the first and the second output terminals 50a and 50b of the input amplification unit 10.

Moreover, according to the embodiment, the input amplification unit 10 comprises a switch device 320 operatively connected between the first and the second output terminal 50a, 50b of the input amplification unit 10. The switch device 320 is adapted to be closed when the reset signal is in the first state. Furthermore, the switch device 320 is adapted to be open when the reset signal is in the second state. In FIG. 6, the switch device 320 is shown as an NMOS transistor having its gate terminal connected to the reset terminal 60 of the input amplification unit 10. However, the switch device 320 may be e.g. be implemented with a PMOS transistor, e.g. controlled with the inverse of the reset signal. As a further example, the switch device 320 may be implemented as a transmission gate. The transmission gate may e.g. comprise an NMOS transistor, controlled with the reset signal, and a PMOS transistor, controlled with the inverse of the reset signal, connected in parallel between the first and the second output terminal 50a and 50b of the input amplification unit 10.

FIG. 6 includes bias circuitry comprising transistors 325, 330, 350, and 360. This bias circuitry may be a part of the input amplification unit 10. Alternatively, the bias circuitry may be external to the input amplification unit 10. For example, the bias circuitry may be shared among a plurality of latched comparator circuits on a chip.

The PMOS transistor 325 is diode connected, i.e. has its gate terminal connected to its drain terminal. Furthermore, the PMOS transistor 325 is biased with a bias current $I_b$. The gate terminal of the PMOS transistor 325 is connected to the gate terminals of the PMOS transistors 330 and 340 for mirroring the bias current $I_b$ to the PMOS transistors 330 and 340. The ratio between the drain current of the PMOS transistor 340 and the bias current, i.e. the mirroring factor, is approximately equal to the ratio between the width-over-length (W/L) ratio of the PMOS transistor 340 and the W/L ratio of the PMOS transistor 325. Similarly, when the reset signal is in the first state, the ratio between the drain current of the PMOS transistor 330 and the bias current is approximately equal to the ratio between the W/L ratio of the PMOS transistor 330 and the W/L ratio of the PMOS transistor 325.

The drain current of the PMOS transistor 340 is injected into the source terminals of the PMOS transistors 300a and 300b of the differential transistor pair for biasing the differential transistor pair.

When the reset signal is in the first state, the switch device 320 is closed and the output voltages at the output terminals 50a and 50b of the input amplification unit are balanced, i.e. forced to be approximately equal. Furthermore, the NMOS transistor 350 is in a conductive state. Thereby, the drain current of the PMOS transistor 330 is injected into the drain terminal of the NMOS transistor 360 via the transistor 350. This current is mirrored to the NMOS transistors 370a and 370b. The W/L ratios of, e.g., the transistors 330, 340, 360, 370a and 370b may be selected such that the channel conductance of the transistors 370a and 370b is relative low when the reset signal is in the first state. Thereby, the switch device 320 may be implemented with a transistor having a relatively small W/L ratio. The larger the channel conductance of the transistors 370a and 370b, the larger W/L ratio is required for a transistor implementing the switch device 320 in order to overcome a positive feedback provided by the cross-coupled pair of transistors 310a, 310b and balance the output voltages of the input amplification unit 10. Suitable transistor sizes may e.g. be derived by means of simulations and/or measurements.

When the reset signal makes a transition to the second state, the PMOS transistor 350 enters a nonconductive state. Thereby, the gate-to-source voltages ($V_{GS}$) of the NMOS transistors 370a and 370b gradually increases and approaches the supply voltage (labelled $V_{DD}$ in FIG. 6). Hence, the channel charge, and therefore the channel conductance, of each of these NMOS transistors 370a and 370b are gradually increased compared with when the reset signal is in the first state. At the same time, the switch device 320 is opened. Thereby, a voltage difference is allowed develop between the first output terminal 50a and the second output terminal 50b of the input amplification unit 10. If the first input voltage, i.e. the voltage at the first input terminal 40a of the input amplification unit 10, is lower than the second input voltage, i.e. the voltage at the second input terminal 40b of the input amplification unit 10, the drain current of the PMOS transistor 300a will be larger than the drain current of the PMOS transistor 300b. As a consequence, the first output voltage, i.e. the voltage at the first output terminal 50a of the input amplification unit 10, will be higher than the second output voltage, i.e. the voltage at the second output terminal 50b of the input amplification unit 10. On the other hand, if the second input voltage, i.e. the voltage at the second input terminal 40b of the input amplification unit 10, is lower than the first input voltage, i.e. the voltage at the first input terminal 40a of the input amplification unit 10, the drain current of the PMOS transistor 300b will be larger than the drain current of the PMOS transistor 300a. As a consequence, the second output voltage, i.e. the voltage at the second output terminal 50b of the input amplification unit 10, will be higher than the first output voltage, i.e. the voltage at the first output terminal 50a of the input amplification unit 10.

The cross-coupled transistor pair 310a, 310b provides a positive feedback that amplifies the voltage difference between the output terminals 50a and 50b, thereby speeding up the development of said voltage difference. The gradual channel-conductance increase of the transistors 370a and 370b results in a gradually increasing loop-gain for this positive feedback. This, in turn, further speeds up the operation of the input amplification unit 10, e.g. compared with if the same $V_{GS}$ would have been applied to the transistors 370a and 370b as when the reset signal was in the first state. Furthermore, since the increase of the loop gain is gradual and therefore, to a large extent, takes place after the voltage difference has already started to develop, the resulting speed-up can be obtained without significantly affecting the accuracy of the latched comparator circuit. How fast the gradual increase can be made without significantly affecting the accuracy may e.g. be determined from implementation to implementation, e.g. based on simulations and/or measurements.

According to some embodiments, a complementary solution may be used for the input amplification unit 10, wherein all NMOS transistors in FIG. 6 are replaced with PMOS transistors, all PMOS transistors in FIG. 6 are replaced with NMOS transistors, and all connections to ground and the supply voltage are interchanged.

The input amplification unit 10 of the embodiment illustrated in FIG. 6 is only an example and not intended to limit the scope of the invention. Other types of resettable differential amplifier stages may be used as well. Such resettable amplifier stages may e.g. comprise a switch device connected between output terminals, e.g. as in FIG. 6, or other internal nodes of the differential amplifier stage for resetting the differential amplifier stage. Alternatively or additionally, the differential amplifier stage may comprise switches connected between output terminals and/or other internal nodes of the differential amplifier stage and fixed voltage levels, such as but not limited to a supply voltage or ground, for resetting the differential amplifier stage.

According to some embodiments, an analog-to-digital converter (ADC) comprises one or more of the latched comparator circuit 1, e.g. according to embodiments described above. The ADC may e.g. be any of, but is not limited to, a flash ADC, a successive-approximation ADC, a time-interleaved ADC, a parallel successive-approximation ADC, a pipelined ADC, a folding ADC, an algorithmic ADC, or a sigma-delta ADC. The latched comparator circuit 1 may e.g. be comprised in comparator circuitry for comparing an input voltage of the ADC or a voltage derived therefrom with one or more reference levels, facilitating the generation of a digital output value of the ADC. In some embodiments, the latched comparator circuit may be preceded by one or more preamplifiers of the comparator circuitry.

Furthermore, according to some embodiments, a memory circuit comprises the latched comparator circuit 1, e.g. according to any of the embodiments described above. The memory circuit may e.g. be, but is not limited to, a random-access memory (RAM), such as a static RAM (SRAM) or a dynamic RAM (DRAM), or a read-only memory (ROM). For example, one or more latched comparator circuits 1 may be comprised in sense-amplification circuitry of the memory circuit.

According to some embodiments, an integrated circuit comprises the latched comparator circuit 1, e.g. according to any of the embodiments described above. As nonlimiting examples, the integrated circuit may comprise an ADC and/or a memory circuit that in turn comprises the latched comparator circuit.

Moreover, according to some embodiments, an electronic apparatus comprises the latched comparator circuit 1, e.g. according to any of the embodiments described above. As nonlimiting examples, the electronic apparatus may comprise an integrated circuit, an ADC, and/or a memory circuit that in turn comprises the latched comparator circuit. The electronic apparatus may e.g. be, but is not limited to, a television set, such as a stationary or handheld television set, a liquid-crystal display, a computer monitor, a digital camera, a projector, e.g. such as a VGA projector or the like, or a radio receiver.

According to an embodiment, a method of operating the latched comparator circuit 1 is provided. According to the embodiment, a first and a second input voltage of the latched comparator circuit 1 are received on the first and the second input terminal 40a, 40b, respectively, of the input amplification unit 10. Furthermore, a first and a second output voltage of the input amplification unit 10 are output on the first and the second output terminal 50a, 50b, respectively, of the input amplification unit 10. Moreover, a first and a second output voltage of the buffer unit 20 are output on a first and a second output terminal 70a, 70b, respectively, of the buffer unit 20 based on the first and the second output voltages of the input amplification unit 10. The reset signal is generated based on the first and the second output voltage of the buffer unit 20 and the clock signal and the output signal of the latched comparator circuit 1 is generated based on the first and the second output voltages of the buffer unit 20. In addition, the reset signal is supplied to the input amplification unit 10 for resetting the input amplification unit 10.

The present invention has been described above with reference to specific embodiments. However, other embodiments than the above described are possible within the scope of the invention. The different steps and features of the invention may be combined in other combinations than those described. The scope of the invention is only limited by the appended patent claims.

The invention claimed is:

1. A latched comparator circuit comprising:
an input amplification unit including a first and a second input terminal for receiving a first and a second input voltage, respectively, of the latched comparator circuit, a first and a second output terminal for outputting a first and a second output voltage, respectively, of the input amplification unit, and a reset terminal arranged to receive a reset signal for resetting the input amplification unit;
a buffer unit operatively connected to the first and the second output terminal of the input amplification unit, the buffer unit including a first and a second output terminal for outputting a first and a second output voltage of the buffer unit, respectively; and
a control unit operatively connected to the input amplification unit and the buffer unit, the control unit being adapted to generate the reset signal based on the first and the second output voltage of the buffer unit and a clock signal, and to generate an output signal of the latched comparator circuit based on the first and the second output voltage of the buffer unit;
wherein the input amplification unit is adapted to balance the first and the second output voltage of the input amplification unit when the reset signal is in a first state, and to generate the first and the second output voltage of the input amplification unit by amplifying a voltage difference between the first and the second input voltage when the reset signal is in a second state;
wherein the buffer unit includes a clock terminal for receiving the clock signal; and
wherein the buffer unit is adapted to precharge the first and the second output terminal of the buffer unit to a first voltage level when the clock signal is in a first state, and to selectively provide a conductive path to a node having a second voltage level from one of the first and the second output terminals of the buffer unit at least based on the first and the second output voltage of the input amplification unit when the clock signal is in a second state.

2. The latched comparator circuit according to claim 1, wherein the control unit is adapted to set the reset signal in the second state if the clock signal is in the second state and the absolute value of a difference between the first and the second output voltage of the buffer unit is smaller than a threshold value, and otherwise set the reset signal in the first state.

3. The latched comparator circuit according to claim 1, wherein the control unit is adapted to set the reset signal in the second state if the clock signal is in the second state and both of the absolute value of a difference between the first output voltage of the buffer unit and the first voltage level and the absolute value of a difference between the second output voltage of the buffer unit and the first voltage level is smaller than a threshold value, and otherwise set the reset signal in the first state.

4. The latched comparator circuit according to claim 3, wherein the control unit includes:
a first inverter having an input and an output terminal, wherein the input terminal of the first inverter is connected to the first output terminal of the buffer unit; and
a second inverter having an input and an output terminal, wherein the input terminal of the second inverter is connected to the second output terminal of the buffer unit.

5. The latched comparator circuit according to claim 4, wherein the control unit is adapted to generate the output signal of the latched comparator circuit as a differential signal at the output terminals of the first and the second inverter of the control unit.

6. The latched comparator circuit according to claim 4, wherein the control unit further includes:
a first logic gate having an output terminal, a first input terminal operatively connected to the output terminal of the first inverter of the control unit, and a second input terminal operatively connected to the output terminal of the second inverter of the control unit; and
a second logic gate having an output terminal, a first input terminal arranged to receive the clock signal or a signal derived from the clock signal, and a second input terminal operatively connected to the output terminal of the first logic gate of the control unit;
wherein the control unit is adapted to generate the reset signal or a signal from which the reset signal is to be derived at the output terminal of the second logic gate of the control unit.

7. The latched comparator circuit according to claim 1, wherein the buffer unit is adapted to provide said conductive path at least partly through the first and second output terminals of the input amplification unit.

8. The latched comparator circuit according to claim 7, wherein the buffer unit includes:
a first MOS transistor connected to the first output terminal of the input amplification unit at its gate terminal, to the second output terminal of the input amplification unit at its source terminal, and to the first output terminal of the buffer unit at its drain terminal; and a second MOS transistor connected to the second output terminal of the input amplification unit at its gate terminal, to the first output terminal of the input amplification unit at its source terminal, and to the second output terminal of the buffer unit at its drain terminal.

9. The latched comparator circuit according to claim 1, wherein the buffer unit includes:
   a first switch device operatively connected between the first output terminal of the buffer unit and said node having the second voltage level;
   a second switch device operatively connected between the second output terminal of the buffer unit and said node having the second voltage level; and
   a third switch device operatively connected between said node having the second voltage level and the first and the second switch devices of the buffer unit;
   wherein the first and the second switch devices of the buffer unit are arranged to at least partly provide said conductive path in response to the output signal of the latched comparator circuit, and the third switch device is adapted to be open if the clock signal is in the first state and closed if the clock signal is in the second state.

10. The latched comparator circuit according to claim 9, wherein the buffer unit includes:
    a fourth switch device operatively connected between the first output terminal of the buffer unit and a node having the first voltage level; and
    a fifth switch device operatively connected between the second output terminal of the buffer unit and said node having the first voltage level;
    wherein the fourth and the fifth switch devices of the buffer unit are adapted to be closed when the clock signal is in the first state for precharging the first and the second output terminals of the buffer unit to the first voltage level.

11. The latched comparator circuit according to claim 10, wherein the buffer unit is adapted to close the one of the fourth and the fifth switch devices that is operatively connected between said node having the first voltage level and the other one of the first and the second output terminals of the buffer unit based on the output signal of the latched comparator circuit, for maintaining the voltage at said other one of the first and the second output terminals of the buffer unit at the second voltage level.

12. The latched comparator circuit according to claim 1, wherein the input amplification unit includes a cross-coupled pair of transistors operatively connected to the first and second output terminals of the input amplification unit.

13. The latched comparator circuit according to claim 1, wherein the input amplification unit includes a switch device operatively connected between the first and second output terminals of the input amplification unit, wherein the switch device of the input amplification unit is adapted to be closed when the reset signal is in the first state and open when the reset signal is in the second state.

14. The latched comparator circuit according to claim 1, wherein one of the first and the second voltage levels is a power-supply voltage of the buffer unit and the other one of the first and the second voltage levels is 0 V.

15. The latched comparator circuit according to claim 1, wherein the latched comparator circuit is included in an analog-to-digital converter.

16. The latched comparator circuit according to claim 1, wherein the latched comparator circuit is included in a memory circuit.

17. The latched comparator circuit according to claim 1, wherein the latched comparator circuit is included in an integrated circuit.

18. The latched comparator circuit according to claim 1, wherein the latched comparator circuit is included in one of a television set, a liquid-crystal display, a computer monitor, a digital camera, a projector, and a radio receiver.

* * * * *